(12) United States Patent
Valenti, III

(10) Patent No.: US 8,008,906 B2
(45) Date of Patent: Aug. 30, 2011

(54) PRIME-BASED FREQUENCY SAMPLING

(75) Inventor: Joseph Leo Valenti, III, Longmont, CO (US)

(73) Assignee: Acoustis Marketing Research, Inc., Longmont, CO (US)

( * ) Notice: Subject to any disclaimer, the term of this patent is extended or adjusted under 35 U.S.C. 154(b) by 387 days.

(21) Appl. No.: 12/366,552

(22) Filed: Feb. 5, 2009

(65) Prior Publication Data

US 2010/0194377 A1      Aug. 5, 2010

(51) Int. Cl.
*G01R 13/34* (2006.01)
(52) U.S. Cl. .................................... 324/76.38
(58) Field of Classification Search .............. None
See application file for complete search history.

(56) References Cited

U.S. PATENT DOCUMENTS

| | | | |
|---|---|---|---|
| 7,800,529 B2* | 9/2010 | Burri et al. | 342/194 |
| 2009/0195442 A1* | 8/2009 | Burri et al. | 342/194 |
| 2009/0232012 A1* | 9/2009 | Zseby | 370/252 |
| 2010/0302092 A1* | 12/2010 | Burri et al. | 342/194 |

OTHER PUBLICATIONS

Ivchenko, Vladimir G. et al., "High-Speed Digitizing of Repetitive Waveforms Using Accurate Interleaved Sampling," IEEE Transactions on Instrumentation and Measurement, vol. 56, No. 4, pp. 1322-1328, Aug. 2007.

* cited by examiner

*Primary Examiner* — Jermele M Hollington
(74) *Attorney, Agent, or Firm* — Marsh Fischmann & Breyfogle LLP

(57) ABSTRACT

Various embodiments provide methods, apparatuses, and systems for sampling a waveform using relatively prime sampling methods. A waveform with a first plurality of cycles and a first frequency may be sampled with a waveform sampling device. Sampling the waveform may include sampling the waveform at a sampling rate of the waveform sampling device. Sampling the waveform may include taking a sample number of samples of the waveform where the sample number may be relatively prime with respect to the number of cycles of the waveform. The sample number of samples of the waveform may be interleaved with a controller.

24 Claims, 11 Drawing Sheets

PRIME-BASED FREQUENCY SAMPLING

CROSS-REFERENCES TO RELATED APPLICATIONS

This application is related to the following commonly owned, co-pending application, of which the entire disclosure is incorporated herein, for all purposes, as if fully set forth herein: U.S. patent application Ser. No. 12/337,317 filed on Dec. 17, 2008 by Valenti and entitled "Personal Computer Based Audio Frequency Impedance Analyzer".

BACKGROUND OF THE INVENTION

This disclosure relates in general to methods, apparatuses, and systems for generating and sampling waveforms using relatively prime-based sampling techniques. Some embodiments involve device under test ("DUT") analyzers and, but not by way of limitation, audio frequency impedance analyzers among other things.

Some systems improve or increase the sampling rate by increasing the frequency of sampling. For example, some devices may have a sampling rate of 44.1 Kilohertz. One might instead use a device with a higher sampling rate, such as one that may sample at a rate over 1 Megahertz. Utilizing or developing a higher speed sampler generally comes with a higher cost.

Some systems improve or increase the temporal resolution of a sampling device using a digital storage oscilloscope utilizing random interleaving sampling techniques. These systems require significant amounts of time to work effectively.

There is a need for methods, apparatuses, and systems that can improve the effective sampling rate and resolution capabilities of waveform sampling devices.

BRIEF SUMMARY OF THE INVENTION

Various embodiments improve or increase the effective sampling of a waveform using methods that include relatively prime sampling techniques.

In one embodiment, a method for sampling a waveform using a relatively prime sampling is provided. The waveform may have a first plurality of cycles and a first frequency. The waveform may be sampled with a waveform sampling device. Sampling the waveform may include sampling the waveform at a sampling rate of a waveform sampling device. Sampling the waveform may include taking a sample number of samples of the waveform where the sample number may be relatively prime with respect to the number of cycles of the waveform. The sample number of samples of the waveform may be interleaved with a controller.

In another embodiment, a method for generating waveforms for sampling using relatively prime number sampling is provided. The method may include determining a test frequency, a cycle number, sample rate, and/or a relatively prime sample number. The relatively prime sample number may be relatively prime with respect to a cycle number. An adjusted frequency may be determined, where the adjusted frequency approximately equals the test frequency. The adjusted frequency may also be a function of a relatively prime sample number, a cycle number, and a sampling rate. A waveform may be transmitted with the adjusted frequency with the cycle number of cycles using a waveform generating device.

In another embodiment, a system for sampling a waveform using relatively prime sampling is provided. The system may include a computational device. The system may include a waveform generating device coupled with the computational device. The waveform generating device may be configured to transmit a first waveform. The first waveform may include a plurality cycles and a frequency. The system may include a waveform sampling device coupled with the computational device. The waveform sampling device may be configured to receive a second waveform. The second waveform may include the plurality of cycles and the frequency. The waveform sample device may sample the second waveform at a sampling rate of the wave sampling device. The waveform sampling device may sample the second waveform a sample number of times, where the sample number is relatively prime with respect to the plurality of cycles.

DETAILED DESCRIPTION OF THE INVENTION

Figure 1:
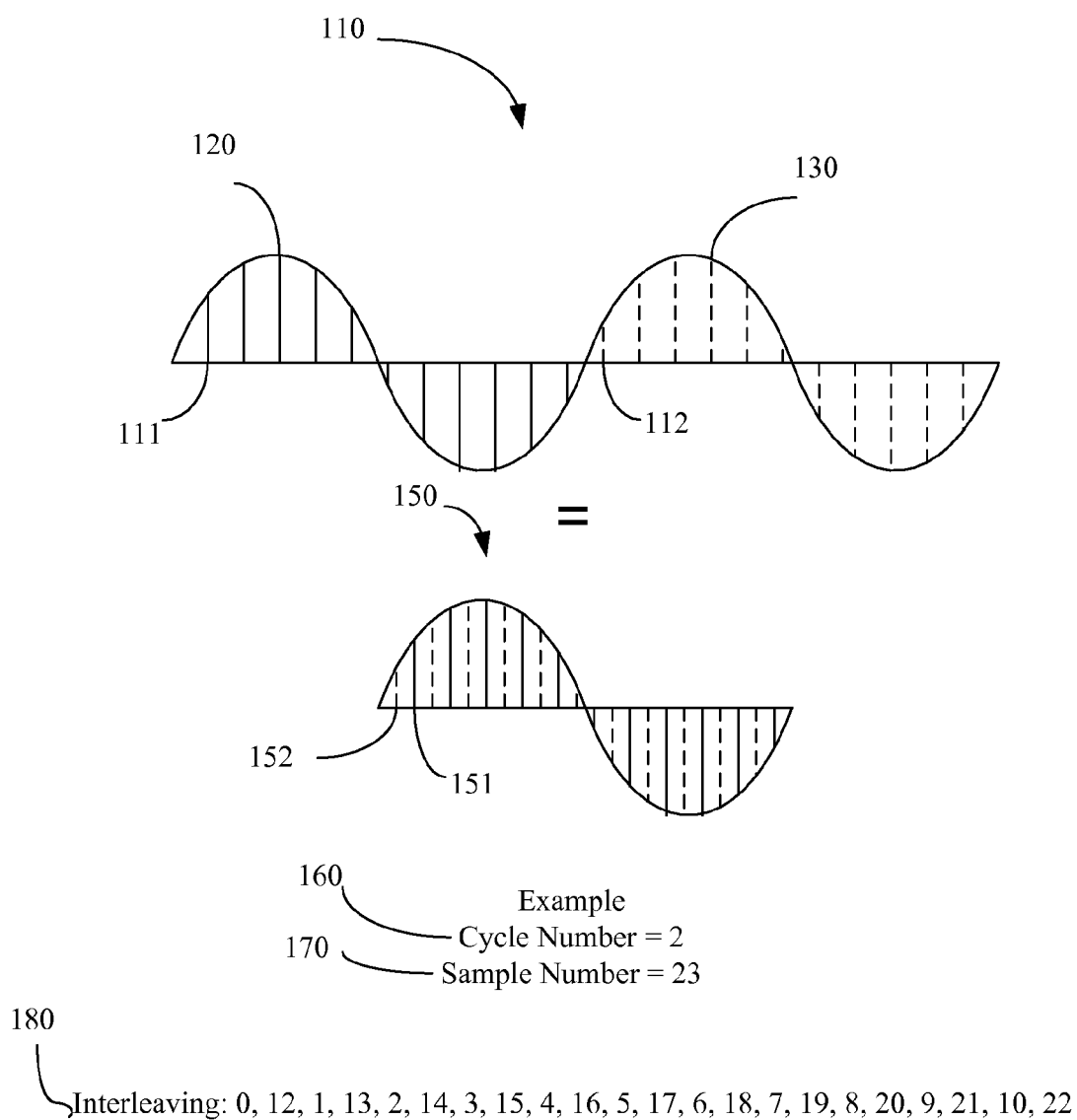
FIG. 1 provides diagrams of embodiments suitable for sampling a waveform with a plurality of cycles with relatively prime sampling and interleaving.

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments, it being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Overview of Embodiments

In one embodiment, a method for sampling a waveform using a relatively prime sampling is provided. A waveform may include a first plurality of cycles and a first frequency. The waveform may be sampled with a waveform sampling device. Sampling the waveform may include sampling the waveform at a first sampling rate of the waveform sampling device. Sampling the waveform may include taking a first sample number of samples of the waveform where the first sample number may be relatively prime with respect to the first plurality of cycles of the waveform.

In some embodiments, a first plurality of cycles may represent the number of repetitions of a basic waveform that comprise the waveform. Embodiments may include a plurality of cycles where the cycles may be considered full cycles. In some embodiments, a first frequency may be represented as a period of the waveform. Some embodiments may include a plurality of cycles where the cycles are full cycles.

In some embodiments, the waveform may be sampled with a waveform sampling device where the waveform sampling device may include a sound card, an audio card, an analog-to-digital converter ("ADC"), a network analyzer, a scalar analyzer, and/or a digital storage oscilloscope. In some embodiments, the waveform sampling device may sample the waveform at a sampling rate. In some embodiments, a sound card or an audio card may be coupled with a computer. The sampling rate may be determined by properties of the waveform sampling device. Merely by way of example, a sound card may have a sampling rate such as 22 Kilohertz (KHz), 44.1 KHz, and/or 48 KHz. A sound card may also have higher or lower sampling rates. Other waveform sampling devices, such as an ADC, may have higher sampling rates. Merely by way of example, in some embodiments, an ADC may have a sampling rate that is of the order of magnitude of 10 KHz, 100 KHz, and/or 1,000 KHz. Some waveform sampling devices may have even higher sampling rates, such as ones with sampling rates of orders of magnitude of 10 Megahertz (MHz), 100 MHz, or 1,000 MHz), or even higher. Some waveform sampling devices may have lower sampling rates, such as ones with sampling rates, merely by way of example, below 22 KHz.

In some embodiments, a first sample number may be a relatively prime number with respect to a cycle number. In some embodiments, a first sample number may be a prime number. In some embodiments, a sample number relatively prime with respect to a cycle number may mean that the sample number and the cycle number share only one positive common integer divisor, that being the number 1. In some embodiments, a sample number may be relatively prime with respect to a number representing the repetition found within a waveform.

In some embodiments, a first sample number may be a function of a sampling rate and a frequency. In some embodiments, a sampling rate may be a first sampling rate of a waveform receiving device. In some embodiments, a frequency may be a first frequency of the waveform being sampled. Merely by way of example, a function representing a sample number (or a number of samples, or in some embodiments, a Minimum Number of Points ("MNOP")), may be represented with the following equation for some embodiments based on a cycle number (or a number of cycles), and a frequency of the waveform and a sample rate of the waveform sampling device:

$$\text{Sample\_Number} = \frac{\text{Cycle\_Numer} \times \text{Sample\_Rate}}{\text{Frequency}}.$$

In some embodiments, a frequency may be determined using a relatively prime sample number (or a number of samples, or sometimes represented as a MNOP), a cycle number (or a number of cycles), and sample rate using an equation based on such a sample number equation:

$$\text{Frequency} = \frac{\text{Cycle\_Number} \times \text{Sample\_Rate}}{\text{Relatively\_Prime\_Sample\_Number}}.$$

In some embodiments, the samples taken of a waveform may be interleaved to represent a sampling of a cycle of the waveform with a higher resolution. In some embodiments, the resolution may represent a higher effective sampling rate. In some embodiments, the effective sampling rate may be approximately equal to a product of the first sampling rate and the number of cycles, or the first plurality of cycles, of the waveform. In some embodiments, interleaving may involve taking samples from each cycle of the plurality of cycles and interleaving them. In some embodiments, interleaving may be achieved by determining an integer position in a data array using the following equation:

$$\text{Position} = \text{Truncate}\left(MNOP \times \text{FractionalPart}\left(\frac{\text{Sample\_Position} \times \text{Cycle\_Number}}{MNOP}\right)\right),$$

where MNOP may be a Minimum Number of Points or, in some embodiments, a relatively prime sample number (or a relatively prime number of samples) taken of a waveform, sample position may be a number representing the position of a sample of the waveform, cycle number (or a number of cycles) may be the number of cycles within the waveform being sampled, and relatively prime sample number may be a number of samples taken of a waveform that is relatively prime with respect to the cycle number.

In some embodiments, interleaving may be done with a controller. A controller may be a variety of devices or components. Merely by way of example, a controller may be or involve a computer, a sampling device, a network analyzer, a scalar analyzer, a digital storage oscilloscope, and/or other devices capable of interleaving samples of a sampling device. One skilled in the art will recognize that interleaving may be achieved by many devices, not limited to the those disclosed.

In some embodiments, a waveform being sampled with a waveform sampling device may be dithered. For some embodiments, dithering a waveform may include adding random noise to each sample of the waveform. In some embodiments, dithering may be an intentionally applied form of noise, used to randomize quantization error, thereby preventing large-scale patterns such as contouring that are more objectionable than uncorrelated noise. In some embodiments, dithering may occur before the waveform is sampled by the waveform sampling device.

In some embodiments, a waveform being sampled by a waveform sampling device may be fitted using least square fitting techniques well known in the art.

In some embodiments, a waveform sampling device may sample more than one waveform using relatively prime sampling methods. In some embodiments, a waveform sampling device may sample a train of waveforms, where the waveforms are separated by time periods. In some embodiments, a waveform may thus comprise a plurality of waveforms, where each of the plurality of waveforms may have a different plurality of cycles. In some embodiments, the plurality of waveforms may have the same number of cycles. In some embodiments, the plurality of waveforms may have different frequencies or amplitudes. In some embodiments, the plurality of waveforms may be sampled at the same sampling rate. In some embodiments, the plurality of waveforms may be sampled at different sampling rates. In some embodiments, the plurality of waveforms may each be sampled a different number of sample times. In some embodiments, the sample number may be the same for each of the plurality of waveforms. In some embodiments, the sample numbers may be relatively prime with respect to the number of cycles in the waveform being sampled. Equations for a sample number or a frequency may be determined in analogy with the equations given for an embodiment with a first waveform and a first sampling number as disclosed in this Application.

In some embodiments, a waveform sampled using relatively prime sampling methods may have been transmitted through a device under test ("DUT"). Merely by way of example, co-pending application U.S. patent application Ser. No. 12/337,317 filed on Dec. 17, 2008 by Valenti and entitled "Personal Computer Based Audio Frequency Impedance Analyzer" provides apparatuses, systems, and methods that may be used with relatively prime sampling techniques involving DUTs for some embodiments. For some embodiments, sampling a waveform using relatively prime sampling methods may also include determining a transfer function for a DUT. Some embodiments may determine an impedance of a DUT. Some embodiments may determine a phase shift of a waveform. Some embodiments may determine an amplitude change of a waveform.

In another embodiment, a method for generating waveforms for sampling using relatively prime number sampling is provided. The method may include determining a test frequency, a cycle number, a sample number, sample rate, and/or a relatively prime sample number. The relatively prime sample number may be a relatively prime number with respect to a cycle number. An adjusted frequency may be calculated with a computational device, where the adjusted frequency approximately equals the test frequency. The adjusted frequency may also be a function of a relatively prime sample number, a cycle number, and a sampling rate. A waveform may be transmitted with the adjusted frequency with the cycle number of cycles using a waveform generating device.

In some embodiments, a test frequency may be determined by a user. In some embodiments, multiple test frequencies may be determined. In some embodiments, a test frequency may be predetermined. In some embodiments, a test frequency may be determined by a computational device. In some embodiments, a test frequency may be determined by a waveform generating device.

In some embodiments, a cycle number may be determined by a user. In some embodiments, a cycle number may be an integer greater than one. In some embodiments, multiple cycle numbers may be determined. In some embodiments, a cycle number may be predetermined. In some embodiments, a cycle number may be determined with a computational device. In some embodiments, a cycle number may be determined with a waveform generating device.

In some embodiments, a sample number may be determined by a user. In some embodiments, multiple sample numbers may be determined. In some embodiments, a sample number may be predetermined. In some embodiments, a sample number may be determined with a computational device. In some embodiments, a sample number may be determined with a waveform generating device.

In some embodiments, a relatively prime sample number may be relatively prime with respect to a cycle number. In some embodiments, a relatively prime sample number may be a prime number. In some embodiments, a relatively prime sample number may be determined by a user. In some embodiments, multiple relatively prime samples numbers may be determined. In some embodiments, a relatively prime sample number may be predetermined. In some embodiments, a relatively prime sample number may be determined with a computational device. In some embodiments, a relatively prime sample number may be determined with a waveform generating device.

In some embodiments, an adjusted frequency may be calculated and/or determined. In some embodiments, an adjusted frequency may be determined by a user. In some embodiments, multiple adjusted frequencies may be determined. In some embodiments, an adjusted frequency may be predetermined. In some embodiments, an adjusted frequency may be determined with a computational device. In some embodiments, an adjusted frequency may be determined with a waveform generating device. In some embodiments, an adjusted frequency approximately equals a test frequency. In some embodiments, an adjusted frequency may be a function of a relatively prime sample number, a cycle number, and a sampling rate. In some embodiments, an adjusted frequency may be calculated by an equation similar to the following using a cycle number (or number of cycles) of a waveform, a sampling rate of a waveform sampling device, and a relatively prime sample number (or relatively prime number of samples or in some embodiments, a MNOP) which may represent the number of samples to be taken of a waveform that is relatively prime with respect to the cycle number:

$$\text{Adjusted\_Frequency} = \frac{\text{Cycle\_Number} \times \text{Sample\_Rate}}{\text{Relatively\_Prime\_Sample\_Number}}.$$

In some embodiments, a waveform may be transmitted with the adjusted frequency with the cycle number of cycles using a waveform generating device. In some embodiments, a waveform generating device may include a sound card, an audio card, an digital-to-analog converter ("DAC"), a network analyzer, a scalar analyzer, and/or a digital storage oscilloscope, or other well known waveform generating devices. In some embodiments, a waveform generating device may be coupled with a computer.

In some embodiments, a waveform generating device may be coupled with a DUT, such that the waveform generating device may transmit a waveform to a DUT. In some embodiments, a waveform transmitted through a DUT may be used to provide measures of the DUT, such as the response of the DUT to the waveform. In some embodiments, a waveform representing a response of a DUT may be used to determine a transfer function, an impedance, a phase shift, an amplitude change, and/or other measures of the DUT.

In some embodiments, the waveform sampling device may sample the waveform at a sampling rate that may be transmitted from a waveform generating device. Some embodiments will sample a second waveform that is different from a first waveform transmitted from a waveform generating device. In some embodiments, the first waveform and the second waveform may be the same waveform. In some embodiments, a waveform generating device may be coupled with a computer. A waveform sampling device may sample the second waveform a relatively prime sample number of times. Some embodiments may interleave a relatively prime sample number of samples using a controller. A controller may be a variety of devices or components. Merely by way of example, a controller may be or include a computer, a sampling device, a network analyzer, a scalar analyzer, a digital storage oscilloscope, and/or other devices/components capable of interleaving samples of a sampling device.

In another embodiment, a system for sampling a waveform using relatively prime sampling is provided. The system may include a computational device. The system may include a waveform generating device. The waveform generating device may couple with a computational device. The waveform generating device may be configured to transmit a waveform. The waveform may be a first waveform that may include a plurality of cycles at a frequency. The plurality of cycles at a frequency may coincide with a first sample number. The system may include a waveform sampling device. The waveform sampling device may couple with a computational device. The waveform sampling device may be configured to receive a waveform. The waveform may be a second waveform that includes the plurality of cycles at the frequency. The waveform sampling device may sample the waveform at a sampling rate of the waveform sampling device. The waveform sampling device may sample the waveform a sample number of times, where the sample number is relatively prime with respect to the plurality of cycles. The waveform sampling device and the waveform generating device may be components of another device, such as a network analyzer, scalar analyzer, or a computer, merely by way of example. In some embodiments, a waveform may be transmitted to a device under test ("DUT") from the waveform generating device and then received by the waveform sampling device after the waveform has passed through the DUT. In some embodiments, a waveform transmitted from the waveform generating device may pass to the waveform sampling device without passing through a DUT. In some embodiments, samples of a waveform that passes through a DUT and a waveform that does not pass through a DUT may be compared to determine different measures of the DUT, such as a transfer function, an amplitude shift, a phase shift, or other measures of the DUT.

In another embodiment, a device for sampling waveforms using relatively prime sampling is provided. The device for sampling waveforms using relatively prime sampling may include a sampling means for sampling a waveform where the waveform has a plurality of cycles and a frequency. Sampling the waveform may include sampling at a sampling rate. Sampling of the waveform may include sampling a sample number of samples of the waveform, where the sample number is relatively prime with respect to the plurality of cycles.

In some embodiments of a device for sampling waveforms using relatively prime sampling, a sampling means may include a sound card, an audio card, an analog-to-digital converter ("ADC"), a network analyzer, a scalar analyzer, and/or a digital storage oscilloscope. In some embodiments, the sampling means may sample the waveform at a sampling rate of a sound card, an audio card, an analog-to-digital converter ("ADC"), a network analyzer, a scalar analyzer, and/or a digital storage oscilloscope. In some embodiments, a sound card or audio card may be coupled with a computer. The sampling rate may be determined by properties of the receiving means. Merely by way of example, a sound card may have a sampling rate such as 22 Kilohertz (KHz), 44.1 KHz, and/or 48 KHz. A sound card may also have higher or lower sampling rates. Other sampling means, such as an ADC, may have higher sampling rates. Merely by way of example, in some embodiments, an ADC or other waveform sampling device may have a sampling rate that is of the order of magnitude of 10 KHz, 100 KHz, 1,000 KHz. Some sampling means may have even higher sampling rates, such as ones with sampling rates of orders of magnitude of 10 Megahertz (MHz), 100 MHz, or 1,000 MHz, or even higher. Some waveform sampling devices may have lower sampling rates, such as ones with sampling rates, merely by way of example, below 22 KHz.

In some embodiments, a device for sampling waveforms using relatively prime sampling may include means for dithering samples of a waveform. Dithering means may include adding random noise to each sample of the waveform. In some embodiments, dithering may be an intentionally applied form of noise, used to randomize quantization error, thereby preventing large-scale patterns such as contouring that are more objectionable than uncorrelated noise. In some embodiments, dithering may occur before the waveform is sampled by the waveform receiving device.

In some embodiments, a device for sampling waveforms using relatively prime sampling may include means for determining a relatively prime sample number that may be relatively prime with respect to a cycle number. A means for determining a relatively prime sample number may involve calculating the relatively prime sample number. A means for determining a relatively prime sample number may determine a prime number. A means for determining a relatively prime sample number may be with a computational device. A means for determining a relatively prime sample number may be with a waveform generating device or a waveform sampling device. A means for determining a relatively prime sample number may be determined by a user. In some embodiments, a means for determining a relatively prime sample number may determine multiple relatively prime sample numbers. A means for determining a relatively prime sample number may be predetermined.

In some embodiments, a means for determining an adjusted frequency may be calculated and/or determined. A means for determining a relatively prime sample number may involve calculating the adjusted frequency. In some embodiments, a means for determining an adjusted frequency may be determined by a user. In some embodiments, multiple adjusted frequencies may be determined. In some embodiments, an adjusted frequency may be predetermined. In some embodiments, a means for determining an adjusted frequency may be calculated or determined with a computational device. In some embodiments, a means for determining an adjusted frequency may be calculated or determined with a waveform generating device. In some embodiments, an adjusted frequency approximately equals a test frequency. In some embodiments, a means for determining an adjusted frequency may be calculated or determined by a user. In some embodiments, an adjusted frequency may be a function of a relatively prime sample number, a cycle number, and a sampling rate. In some embodiments, an adjusted frequency may be calculated by an equation similar to the following using a cycle number (or number of cycles) of a waveform, a sampling rate of a waveform sampling device, and a relatively prime sample number (or relatively prime number of samples or in some embodiments, a MNOP), which may represent the number of samples to be taken of a waveform that is relatively prime with respect to the cycle number:

$$\text{Adjusted\_Frequency} = \frac{\text{Cycle\_Number} \times \text{Sample\_Rate}}{\text{Relatively\_Prime\_Sample\_Number}}.$$

In some embodiments, a device for sampling waveforms may include a means for transmitting a waveform with an adjusted frequency with a cycle number of cycles using a waveform generating device. In some embodiments, a means for transmitting may be a sound card, an audio card, an digital-to-analog converter ("DAC"), a network analyzer, a scalar analyzer, and/or a digital storage oscilloscope, or other well known waveform transmitting devices. In some embodiments, a means for transmitting may be coupled with a computer.

In some embodiments, a means for transmitting may be coupled with a DUT, such that the waveform generating device may transmit a waveform to a DUT. In some embodiments, a waveform transmitted through a DUT may be used to provide measures of the DUT, such as the response of the DUT to the waveform. In some embodiments, a waveform representing a response of a DUT may be used to determine a transfer function, an impedance, a phase shift, an amplitude change, and/or other measures of the DUT.

Turning now to the figures, embodiments provide apparatuses, systems, and methods for sampling a waveform using relatively prime sampling methods. Such apparatuses, systems, and methods may include receiving a waveform 110 such as that seen in FIG. 1, which provides an overview of relatively prime sampling.

FIG. 1 provides waveform 110, which includes two cycles of a base waveform represented by base waveform 120 and base waveform 130, which are the same in shape. Waveforms 110, 120, and 130 may also have the same frequency. Samples of waveform 110 such as 111 and 112 may be taken as waveform 110 is sampled by a waveform receiving and/or sampling device. Merely by way of example, resulting waveform 150 may be produced by interleaving samples of waveform 110 such as 111 and 112. In resulting waveform 150, sample 151 may correspond with sample 111 and sample 152 corresponds to sample 112. In some embodiments, the samples taken of waveform 110 may be interleaved as shown with interleaving pattern 180. Other embodiments may provide other interleaving patterns. FIG. 1 provides an embodiment where the number of samples, or sample number, 170 sampled of waveform 110 is relatively prime with respect to the number of cycles, or cycle number, 160 within waveform 110. In some embodiments, sample number 170 may be a prime number. Merely by way of example, sample number 170 in this case is the number 23, while cycle number 160 is the number 2. These two numbers are relatively prime with respect to each other as the only positive common integer divisor the two numbers share is the number 1. In general, relatively prime sampling apparatuses, systems, and methods may work where the cycle number is at least two. In some embodiments, the cycle number may be two. In other embodiments, the cycle number may take on numerous other values, as long as the cycle number may be at least two. Merely by way of example, a cycle number may be orders of magnitude larger than those shown here, such as from 10, to 100, to 1000, to 10,000, times larger, and possibly even larger. Furthermore, the sample number may be orders of magnitude larger than shown in these embodiments. Merely by way of example, a sample number may be orders of magnitude larger, merely by way of example, from 10, 1000, 10000, or 100000 times larger, or even larger, than the embodiments shown here. Furthermore, in general, a cycle number and a sample may be relatively prime with respect to each other with relatively prime sampling methods, apparatuses, and systems.

Figure 2:
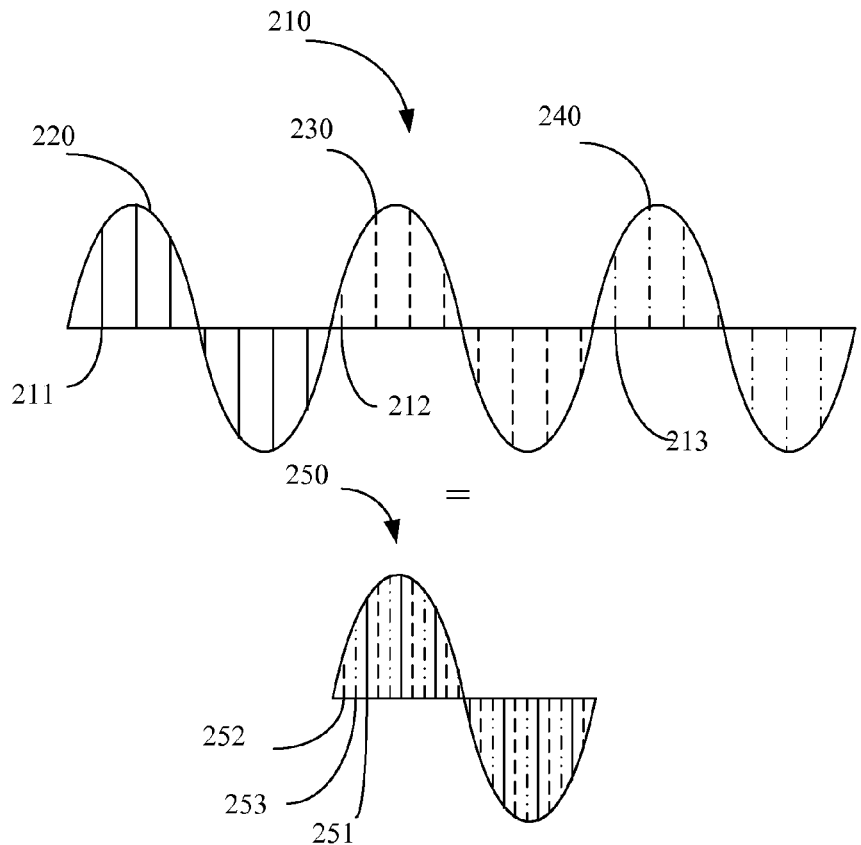
FIG. 2 provides diagrams of embodiments suitable for sampling a waveform with a plurality of cycles with relatively prime sampling and interleaving.

FIG. 2 provides another embodiment where waveform 210 includes three cycles of a base waveform represented by base waveforms 220, 230, and 240, which are the same in shape. Waveforms 210, 220, 230, and 240 may have the same frequency. Samples of waveform 210 such as 211, 212, and 213 may be taken as waveform 210 is sampled by a waveform receiving and/or sampling device. Merely by way of example, resulting waveform 250 may be produced by interleaving samples of waveform 210 such as 211, 212, and 213. In resulting waveform 250, sample 251 may correspond with sample 211, sample 252 may correspond with sample 212, and sample 253 corresponds to sample 213. In some embodiments, the samples taken of waveform 210 may be interleaved as shown with interleaving pattern 280. Other embodiments may provide other interleaving patterns. FIG. 2 provides an embodiment where the number of samples, or sample number, 270 sampled of waveform 210 is relatively prime with respect to the number of cycles, or cycle number, 260 within waveform 210. In some embodiments, sample number 270 may be a prime number. Merely by way of example, sample number 270 in this case is the number 23, while cycle number 160 is the number 3. These two numbers are relatively prime with respect to each other as the only positive common integer divisor the two numbers share is the number 1. In general, relatively prime sampling apparatuses, systems, and methods may work where the cycle number is at least two. In some embodiments, the cycle number may be three. In other embodiments, the cycle number may take on numerous other values greater than the number 1. Furthermore, in general, a cycle number and a sample may be relatively prime with respect to each other with relatively prime sampling methods, apparatuses, and systems.

Figure 3:
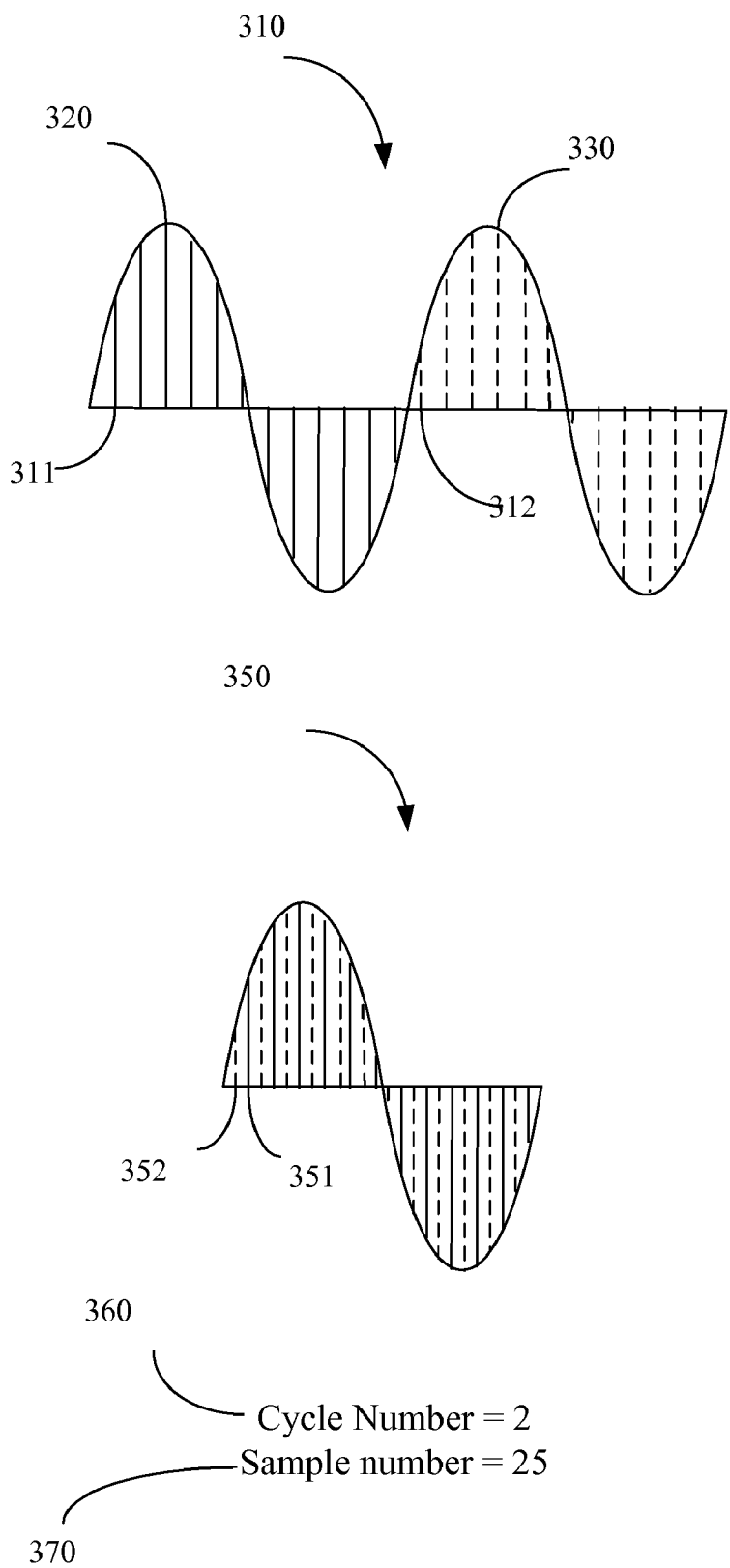
FIG. 3 provides diagrams of embodiments suitable for sampling a waveform with a plurality of cycles with relatively prime sampling and interleaving.

FIG. 3 provides another embodiment where waveform 310 includes two cycles of a base waveform represented by base waveform 320 and base waveform 330, which are the same in shape. Waveforms 310, 320, and 330 may have the same frequency or period. Samples of waveform 310 such as 311 and 312 may be taken as waveform 310 is sampled by a waveform receiving and/or sampling device. Merely by way of example, resulting waveform 350 may be produced by interleaving samples of waveform 310 such as 311 and 312. In resulting waveform 350, sample 351 may correspond with sample 311 and sample 352 corresponds to sample 312. In some embodiments, the samples taken of waveform 310 may be interleaved as shown within resulting waveform 350. Other embodiments may provide other interleaving patterns. FIG. 3 provides an embodiment where the number of samples, or sample number, 370 sampled of waveform 310 is relatively prime with respect to the number of cycles, or cycle number, 360 within waveform 310. In some embodiments, sample number 370 may be a prime number. Merely by way of example, sample number 370 in this case is the number 25, while cycle number 360 is the number 2. These two numbers are relatively prime with respect to each other as the only positive common integer divisor the two numbers share is the number 1. In this embodiment, sample number 370 does not have to be a prime number. Rather, this embodiment shows that a sample number may be relatively prime with respect to a cycle number without the sample number having to be a prime number. In general, relatively prime sampling apparatuses, systems, and methods may work where the cycle number may be at least two. In some embodiments, the cycle number may be two. In other embodiments, the cycle number may take on numerous other values. Furthermore, in general, a cycle number and a sample may be relatively prime with respect to each other with relatively prime sampling methods, apparatuses, and systems.

Figure 4:
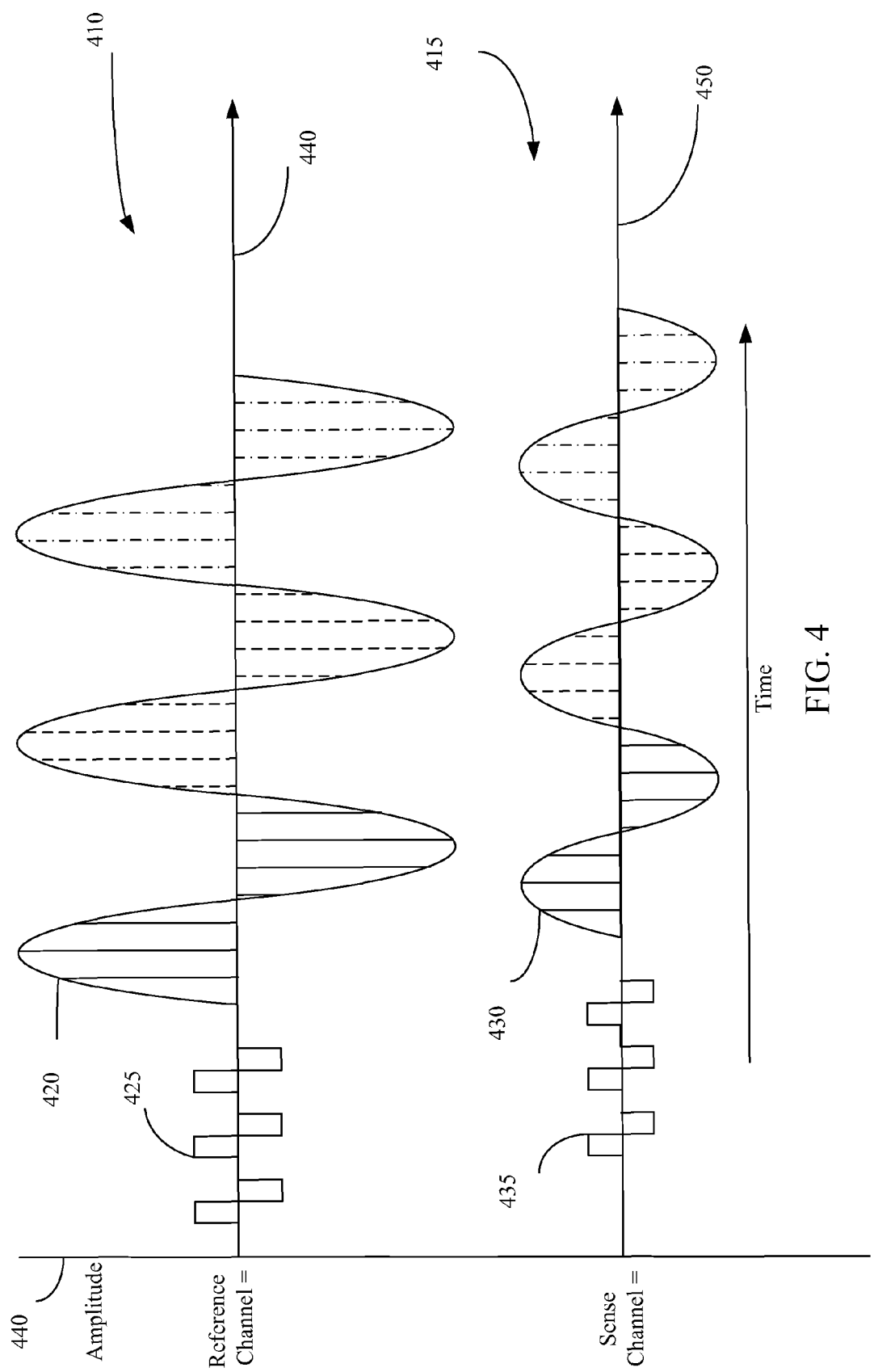
FIG. 4 provides diagrams of embodiments suitable for sampling a waveform with a plurality of cycles with relatively prime sampling and interleaving involving a sampled reference waveform and a sampled sense waveform.

FIG. 4 provides embodiments where a waveform 420 used for relatively prime sampling may be affected in some way, resulting in it being transformed into another waveform 430. In some embodiments, waveform 430 results from a waveform like 420 passing through a device under test ("DUT"). In some embodiments, waveform 420 may represent a waveform associated with a reference channel 410. In some embodiments, waveform 430 may represent a waveform associated with a sense channel 415. In some embodiments, waveform 420 represents a waveform that may be transmitted from a waveform generating device. In some embodiments, waveform 420 may represent a waveform that has passed through circuitry excluding a DUT. FIG. 4 shows the amplitudes of the waveforms along a vertical axis 440. Two horizontal axes 440 and 450 generally represent a time dimension. In addition, FIG. 4 provides embodiments where waveforms such as 420 and 430 may be preceded by timing waveforms 425 and 435, which may be used to help synchronize or otherwise coordinate data that is captured when a waveform such as 420 or 430 is sampled using relatively prime sampling methods, apparatuses, and systems.

Figure 5:
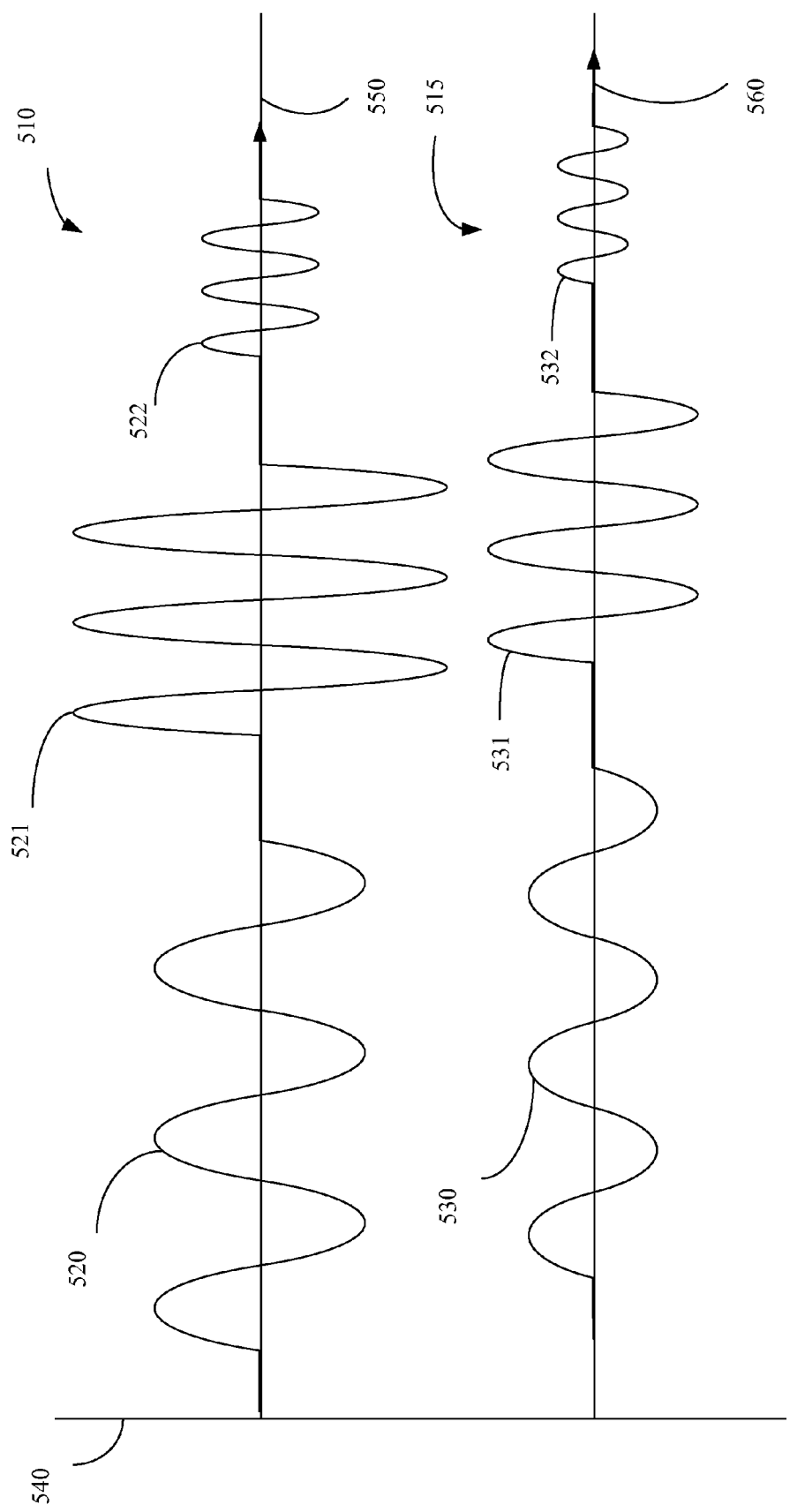
FIG. 5 provides diagrams of embodiments suitable for sampling a waveform with a plurality of cycles with relatively prime sampling and interleaving with waveforms with different frequencies and amplitudes.

FIG. 5 provides embodiments where a waveform for relatively prime sampling may include a train of waveforms, where each part of the train of waveforms may have different amplitudes, frequencies, cycle numbers, and/or sample numbers. Waveform train 510 may represent a waveform including: a first waveform 520 with a first frequency, a first amplitude, a first cycle number, and a first sample number; second waveform 521 with a second frequency, a second amplitude, a second cycle number, and a second sample number; and a third waveform 522 with a third frequency, a third amplitude, a third cycle number, and a third sample number. Waveform train 510 may be altered in some way, such as if it were to pass through a DUT, resulting in some embodiments in another waveform train 515. Waveform train 515 may represent a waveform including: a fourth waveform 530 with the first frequency, a fourth amplitude, the first cycle number, and the first sample number; fifth waveform 531 with the second frequency, a fifth amplitude, the second cycle number, and the second sample number; and a sixth waveform 532 with the third frequency, a sixth amplitude, the third cycle number, and the third sample number. As seen with FIG. 4, FIG. 5 includes vertical axis 540 representing amplitude of the waveforms and horizontal axes 550 and 560 representing time. Some embodiments may include more or less waveforms within their train of waveforms.

Figure 11:
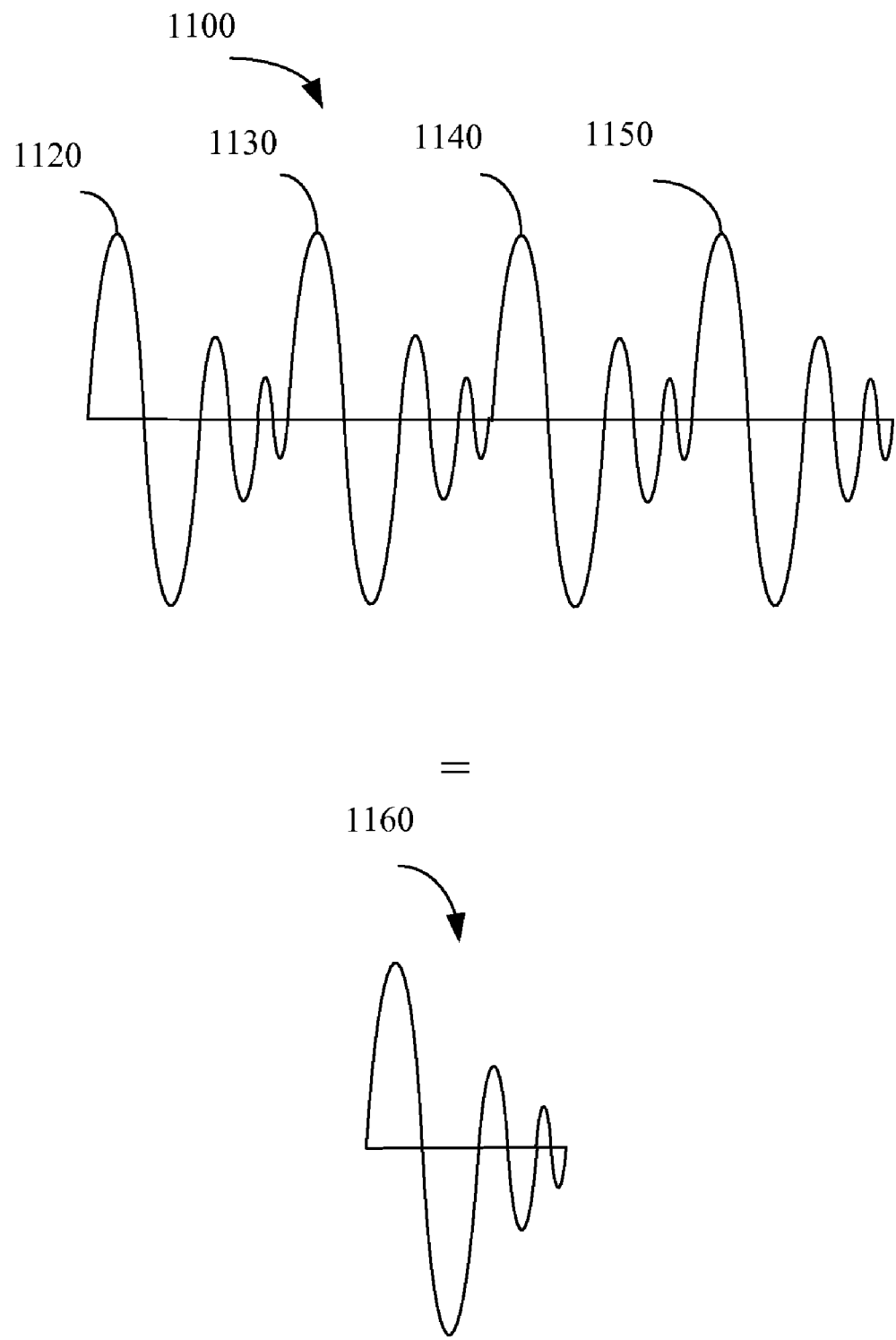
FIG. 11 provides diagrams of embodiments suitable for sampling a waveform with a plurality of cycles with relatively prime sampling and interleaving with waveforms with different frequencies and amplitudes.

While embodiments disclosed within FIGS. 1, 2, 3, 4, and 5 generally disclose waveforms representing sine waves, other waveforms may be used in other embodiments. For example, waveforms represent square waveforms, sawtooth waveforms, ramp waveforms, or other well-known waveforms may be used. Furthermore, in some embodiments, a waveform used for relatively prime-based sampling may be generated utilizing a base waveform comprising many frequencies thus representing a complicated waveform. In such embodiments, methods, apparatuses, and systems utilizing relatively prime based sampling may still be used where the embodiment generates an overall waveform that includes two or more copies, or cycles, of the complicated base waveform and the number of copies, or cycle number, of the complicated base waveform may be relatively prime with respect to the number of samples taken of the overall waveform. FIG. 11 provides embodiments where the waveform 1100 comprises multiple cycles of a more complicated base waveform, shown as 1120, 1130, 1140, and 1150, that may be sampled using relatively prime sampling to represent a resulting waveform 1160. As one skilled in the art will recognize, FIGS. 1, 2, 3, 4, 5, and 11 may show idealized waveforms; actual waveforms used with embodiments of relatively prime sampling may include noise and other distortions making them deviate from idealized waveforms.

Methods

In some embodiments, methods may be provide for sampling a waveform using relatively prime sampling methods. Some embodiments may be used for testing the response of a DUT to a waveform using stimulus and response techniques. Stimulus and response techniques may be used to measure both calibration and DUT measure functions. An overview of embodiments suitable for methods involving relatively prime sampling is provided in the flow diagram of FIG. 6.

At block 605, a test frequency of a waveform may be determined. In some embodiments, the test frequency may be provided by a user. The test frequency may also be predetermined or provided by another source such as a computational device or waveform generating and/or sampling device, merely by way of example. The test frequency may be represented as a period of the waveform in some embodiments. A period in general is inversely related to a frequency. More than one test frequency may be determined. For example, a user may provide a series of test frequencies to be used in analyzing the response of a DUT. Along with determining at least one test frequency at block 605, amplitudes for each waveform may also be determined. As with the test frequency, the amplitude may be determined by a user or may be predetermined or may be provided by another source. At block 605, other details regarding a test waveform with a test frequency may also be determined. Merely by way of example, the shape of the waveform with a test frequency may also be determined. For example, a waveform may comprise sine waves, square waves, sawtooth waves, or any one of numerous well known waveforms. In some embodiments, a complicated waveform may be created that is a composition of other waveforms.

At block 610, a sample rate may be determined. A sample rate may also be referred to as a sampling rate. A sample rate may be provided by a user. The sample rate may also be predetermined or provided by another source such as a computational device or waveform generating and/or sampling device, merely by way of example. The sample rate may be determined by the properties of a waveform sampling device. Merely by way of example, a waveform sampling device such as a sound card attached to a computer may have a sample rate such as 44.1 Kilohertz, or 48 Kilohertz, or other possible sample rates. Some waveform sampling devices, such as some analog-to-digital converters, may have higher or lower sample rates.

At block 615, a cycle number may be determined. A cycle number may be a number of base waveforms at a test frequency. A cycle number may represent the repetition within a waveform. A general waveform may comprise a number of copies of a base waveform, wherein the number of copies may be the cycle number. In general, a cycle number may refer to a total number of complete cycles of a test waveform at a test frequency. A cycle number may be determined for each test frequency if there is more than one test frequency. Cycle numbers may be provided by a user. Cycle numbers may also be predetermined or provided by another source, such as a computational device or waveform generating and/or sampling device, merely by way of example.

At block 620, a sample number may be determined. A sample number may be the number of samples comprising a test waveform with a cycle number at a test frequency. A sample number may be determined for each test frequency. A sample number may be provided by a user. A sample number may be predetermined or provided by another source, such as a computational device or waveform generating and/or sampling device, merely by way of example.

At block 625, a relatively prime sample number may be determined. A relatively prime sample number may be determined for each sample number determined at block 620. A relatively prime sample number may be a sample number that is a relatively prime number with respect to a cycle number determined in block 615. Two different numbers are relatively prime with respect to each other when their only positive common integer divisor is the number 1. In some embodiments, a relatively prime sample number may be approximately a sample number determined in block 620. A relatively prime sample number may be the relatively prime number with respect to a cycle number from block 615 that is closest to a sample number from block 620. In some embodiments, a relatively prime sample number may be a prime number. In some embodiments, a user may provide a relatively prime sample number. In some embodiments, a relatively prime sample number may be calculated or determined with a computer or other device, such as a computational device or waveform generating and/or sampling device, merely by way of example. In some embodiments, a relatively prime sample number be determined by other well known techniques, such as from a table of numbers. In some embodiments, a relatively prime sample number may be predetermined.

At block 630, a test frequency determined in block 605 may be adjusted. A test frequency may be adjusted in order that the length of a waveform at the adjusted test frequency coincides with the relatively prime sample number. Merely by way of example, an adjusted test frequency may be determined in some embodiments such that:

$$\text{Test\_Frequency} = \frac{\text{Cycle\_Number} \times \text{Sample\_Rate}}{\text{Relatively\_Prime\_Sample\_Number}},$$

where the cycle number (or number of cycles) may be determined in block 615, the sample rate may be determined in block 610, and the relatively prime sample number (or relatively prime number of samples or in some embodiments, a MNOP) may be determined in block 625. In some embodiments, a cycle number determined in block 615, a sample number determined in block 610, and a relatively prime sample number determined in block 625, may be individually or collectively adjusted in order that the adjusted test frequency determined in block 630 is approximately a test frequency determined in block 605.

It will be recognized that the order of these blocks 605, 610, 615, 620, 625, and 630 may occur in different orders. In some embodiments, not all the blocks will be used within a given method embodiment.

At block 635, a test waveform may be generated using a waveform generating device. A test waveform may be transmitted where the test waveform includes a cycle number of base waveforms at an adjusted test frequency. In some embodiments, an overall test waveform may include a plurality of test waveforms, where each test waveform comprises possibly a different cycle number of cycles of a possibly different base waveform at a possibly different adjusted test frequency. In some embodiments, a sound card coupled with a computer may transmit a generated test waveform. Other waveform generating devices may also be used. For example, a network analyzer, a scalar analyzer, a general digital-to-analog converter, or a function generator may be used. Other devices capable of generating a waveform may also be used. Merely by way of example, a test waveform based on a sine wave may be generated using an equation such as the following that produces amplitudes of test waveform based on a specific sample position, where a specific sample position may range from zero to a relatively prime sample number (or relatively prime number of samples or MNOP) that may be determined in block 625, a cycle number (or number of cycles), the relatively prime sample number (or relatively prime number of samples or MNOP), and a constant C:

$$\text{Amplitude} = C \times \text{Sin}\left(360° \times \text{FractionalPart}\left(\frac{\text{Sample\_Position} \times \text{Cycle\_Number}}{\text{Relatively\_Prime\_Sample\_Number}}\right)\right).$$

At block 640, a test waveform generated at block 635 may be transmitted through a DUT. Merely by way of example, a test waveform may be transmitted to a DUT using a Z box as disclosed in co-pending application U.S. patent application Ser. No. 12/337,317 filed on Dec. 17, 2008 by Valenti and entitled "Personal Computer Based Audio Frequency Impedance Analyzer." At block 645, a test waveform generated at block 635 may also be transmitted without passing through a DUT. In some embodiments, a test waveform that may not be transmitted through a DUT may be used as a reference waveform that may be used for calibration purposes. In some embodiments, a test waveform that may not betransmitted through a DUT may also be used to determine different measures of the DUT when compared with a test waveform that passes through a DUT. In some embodiments, measures of a DUT may include a transfer function, an impedance, a phase shift, an amplitude, and/or other measures of the DUT.

At block 650, test waveforms may be received by a waveform sampling device. In some embodiments, the test waveforms may be received by a sound card. In some embodiments, a waveform receiving device may be an analog-to-digital converter ("ADC"). In some embodiments, a waveform receiving device may be a network analyzer or a scalar analyzer. Other possible waveform sampling devices well known in the art may also be used.

At block 655, received test waveforms may be sampled. In some embodiments, a received test waveform may be sampled at a relatively prime sampling number of times determined at step 625. When an overall test waveform includes several different separate waveforms that are based on different frequencies, each separate waveform may be sampled at a different relatively prime sampling number in some embodiments. Data acquired from sampling a waveform may be recorded and stored on a device. In some embodiments, the device may be a computer, a network analyzer, a scalar analyzer, or any other device capable of recording and storing data from a waveform sampling device or component.

At block 660, a resulting waveform may be created using interleaving. By interleaving a relatively prime number of samples of a test waveform, a representation of a base waveform may be produced. In some embodiments, interleaving of a test waveform produces in effect a sampling of a base waveform of the test waveform at an effective sampling rate equal to a product of a cycle number determined at block 615 and a sample rate determined at block 610. Merely by way of example, interleaving may be achieved in some embodiments by determining an integer position in a data array using the following equation:

$$\text{Position} = \text{Truncate}\left(MNOP \times \text{FractionalPart}\left(\frac{\text{Sample\_Position} \times \text{Cycle\_Number}}{MNOP}\right)\right),$$

where MNOP is Minimum Number of Points (or in some embodiments a relatively prime number of samples), sample position is a number presenting the position of a sample of the waveform, and cycle number is the number of cycles within the waveform being sampled. The truncate function may eliminate the fractional part of a number, leaving the remaining integer part of the number. The fractional part function may eliminate the integer part of a number leaving the remaining fraction part of the number.

Figure 7:
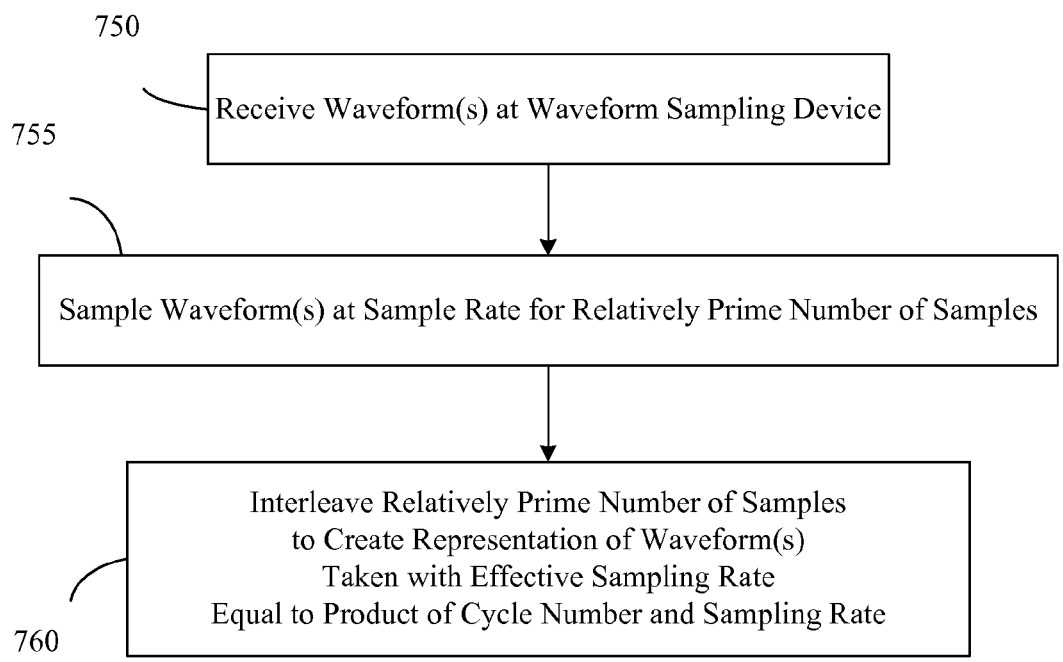
FIG. 7 provides a flow diagram illustrating a method for receiving and sampling a waveform with relatively prime sampling.

Embodiments may also include methods for sampling a waveform with a waveform receiving or sampling device in general using relatively prime based sampling techniques. An overview of embodiments suitable for methods involving relatively prime sampling with a waveform receiving or sampling device is provided in the flow diagram of FIG. 7.

At block 750, waveforms may be received by a waveform receiving or sampling device. In some embodiments, the test waveforms may be received by a sound card. In some embodiments, a waveform sampling device may be an analog-to-digital converter ("ADC"). In some embodiments, a waveform sampling device may be a network analyzer or a scalar analyzer. Other possible waveform sampling devices well known in the art may also be used.

At block 755, received waveforms may be sampled. A received waveform may be sampled at a relatively prime sampling number of times using a waveform sampling device. When an overall waveform includes several different separate waveforms that are based on different frequencies, each separate waveform may be sampled at a different relatively prime sampling number. In some embodiments, data acquired from sampling a test waveform may be recorded and stored on a device, such as a computer with a memory, a network analyzer, a scalar analyzer, or other devices.

At block 760, a resulting waveform may be created using interleaving. By interleaving a relatively prime number of samples of a waveform, a representation of a base waveform may be produced. In some embodiments, interleaving of a waveform produces in effect a sampling of a base waveform of the test waveform at an effectively sampling rate equal to a product of a cycle number and a sample rate. Merely by way of example, in some embodiments, interleaving may be achieved by determining an integer position in a data array using the following equation:

$$\text{Position} = \text{Truncate}\left(MNOP \times \text{FractionalPart}\left(\frac{\text{Sample\_Position} \times \text{Cycle\_Number}}{MNOP}\right)\right),$$

where MNOP is Minimum Number of Points (or in some embodiments a relatively prime number of samples), sample position is a number presenting the position of a sample of the waveform, and cycle number is the number of cycles within the waveform being sampled.

Figure 6:
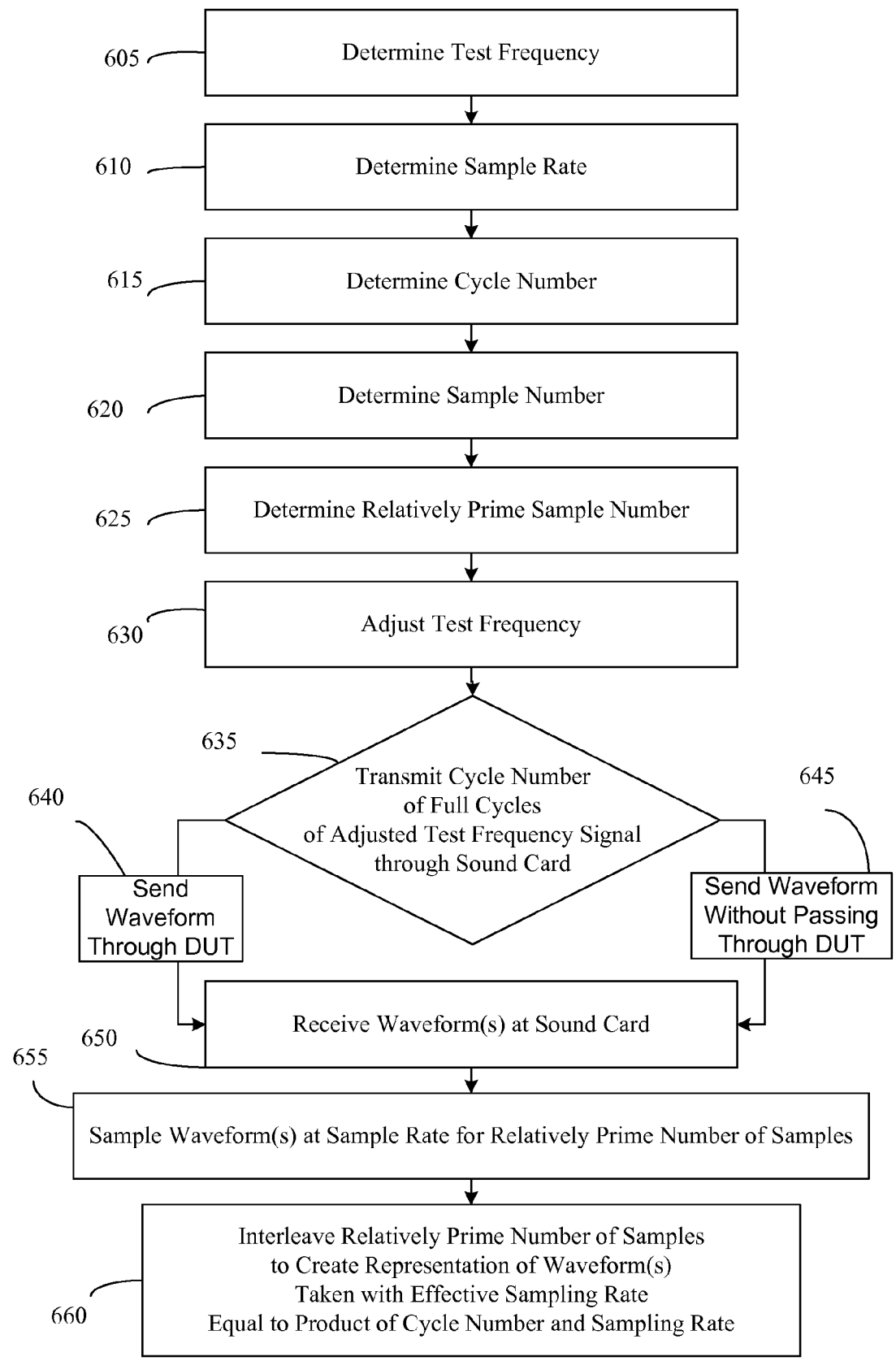
FIG. 6 provides a flow diagram illustrating a method for sampling a waveform with relatively prime sampling.

One skilled in the art will also recognize that the methods taught within FIG. 6 and its accompanying text also teach methods for generating waveforms using a waveform generating device suitable for relatively prime sampling methods in general. Some embodiments, thus, do not require that the waveform be transmitted to a DUT, but rather may be used for other purposes where waveforms may be used.

In some embodiments, the waveform being received by a waveform receiving or sampling device may be dithered. For some embodiments, dithering a waveform may include adding random noise to each sample of the waveform. In some embodiments, dithering may be an intentionally applied form of noise, used to randomize quantization error, thereby preventing large-scale patterns such as contouring that are more objectionable than uncorrelated noise.

In some embodiments, the sampled waveform may be fitted using least square fitting techniques well known in the art.

Systems

Figure 8A:
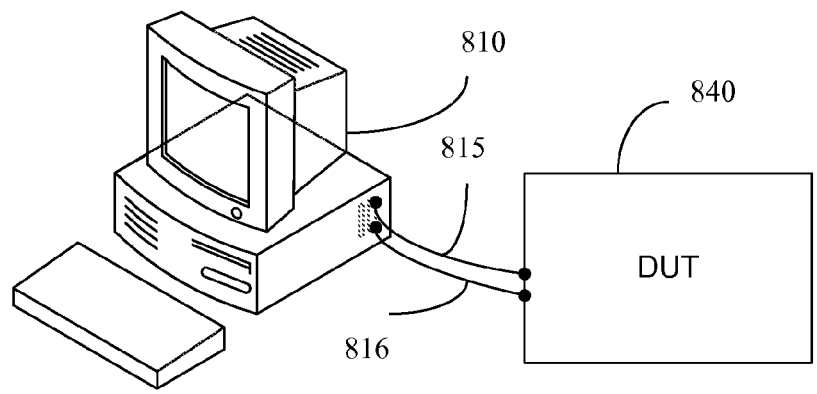
FIG. 8A provides a structural diagram of embodiments suitable for testing the response of a device under test ("DUT") to a waveform using relatively prime sampling.
Figure 8B:
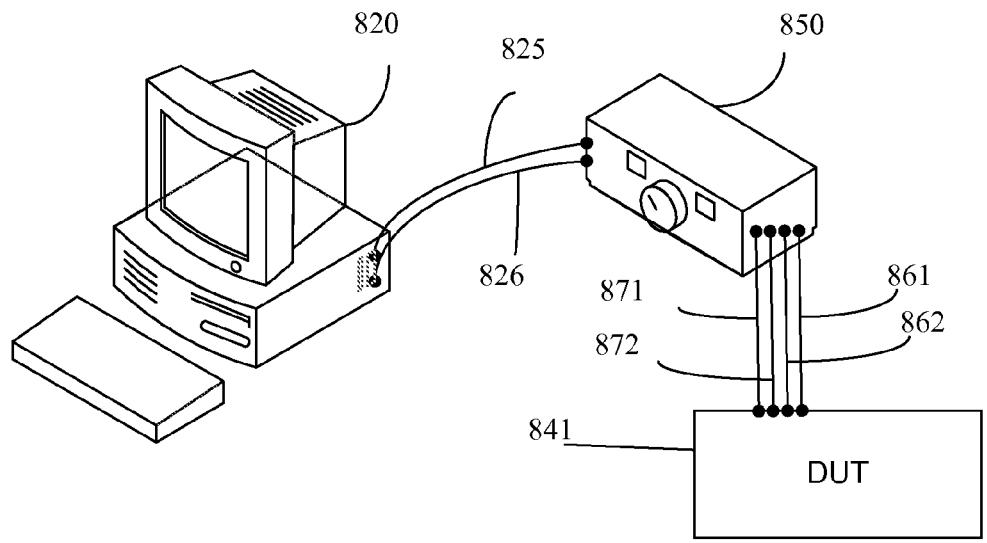
FIG. 8B provides a structural diagram of embodiments suitable for testing the response of a DUT to a waveform using relatively prime sampling.
Figure 8C:
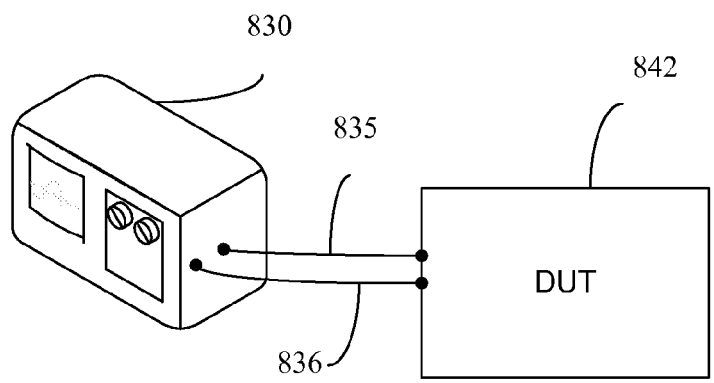
FIG. 8C provides a structural diagram of embodiments suitable for testing the response of a DUT to a waveform using relatively prime sampling.

An overview of embodiments suitable for sampling a waveform using relatively prime sampling techniques is provided in the structural diagrams of FIGS. 8A, 8B, and 8C. These figures represent embodiments involving a variety of apparatuses, devices, and systems suitable for sampling a waveform using relatively prime sampling techniques. One skilled in the art would also recognize there are numerous ways to configure apparatuses and systems to achieve embodiments within the spirit of the invention.

FIG. 8A provides an embodiment involving a computer 810, connectors 815 and 816, and a DUT 840. Connector 815 may be configured to connect with computer 810 to DUT 840 such that a waveform may be transmitted to DUT 840. Connector 816 may be configured to connect DUT 840 with computer 810 such that a waveform that has passed through DUT 840 may be transmitted to computer 810 where the waveform may be sampled using relatively prime based sampling methods. One skilled in the art will recognize there are numerous ways to connect computer 810 with DUT 840. Merely by way of example, numerous connectors are more thoroughly discussed in co-pending application U.S. patent application Ser. No. 12/337,317 filed on Dec. 17, 2008 by Valenti and entitled "Personal Computer Based Audio Frequency Impedance Analyzer." Further details regarding computer 810 may be found within FIG. 10 and its accompanying text.

FIG. 8B provides an embodiment involving a computational device 820, such as a computer, connectors 825, 826, 861, 862, 871, and 872, a Z box 850, and a DUT 841. Merely by way of example, co-pending application U.S. patent application Ser. No. 12/337,317 filed on Dec. 17, 2008 by Valenti and entitled "Personal Computer Based Audio Frequency Impedance Analyzer" more thoroughly describes embodiments involving Z box 850. In general, computational device 820 may be connected with Z box 850 to carry waveforms from a sound card within computational device 820 to Z box 850, which may then be transmitted to DUT 841 through connector 861 and/or connector 862. Connector 871 and/or connector 872 may then carry a waveform that has passed through DUT 841 back to Z box 840, from where the waveform may be transmitted through connector 826 back to computational device 820. As discussed more thoroughly in co-pending application U.S. patent application Ser. No. 12/337,317 filed on Dec. 17, 2008 by Valenti and entitled "Personal Computer Based Audio Frequency Impedance Analyzer," a Z box 850 may be calibrated using different waveforms that are sent to it from computational device 820. Some of these waveforms may not pass through DUT 841, but rather through circuitry of Z box 841 for calibration purposes. Embodiments as in FIG. 8B may be used, as with other embodiments seen in FIGS. 8A and 8C, to determine different measures of DUTs, 841, 841, and 842, such as a transfer function, using relatively prime sampling methods.

FIG. 8C provides embodiments involving an analyzer 830, connectors 835 and 836, and DUT 842. Connector 835 may be configured to connect analyzer 830 with DUT to carry waveforms from analyzer 830 to DUT 842. Connector 833 may be configured to connect DUT 842 with analyzer 830 to transmit waveforms to analyzer 830 for sampling using relatively prime sampling methods. In some embodiments, analyzer 830 may be a network and/or a scalar analyzer. In some embodiments analyzer 830 may include a function generator. In some embodiments, analyzer 830 may include a digital storage oscilloscope. One skilled in the art will recognize that numerous analyzers may provide the functionality involved with relatively prime based sampling of waveforms. In some embodiments, analyzer 830 may receive waveforms while another device produces the waveform that is transmitted to DUT 842.

Figure 9:
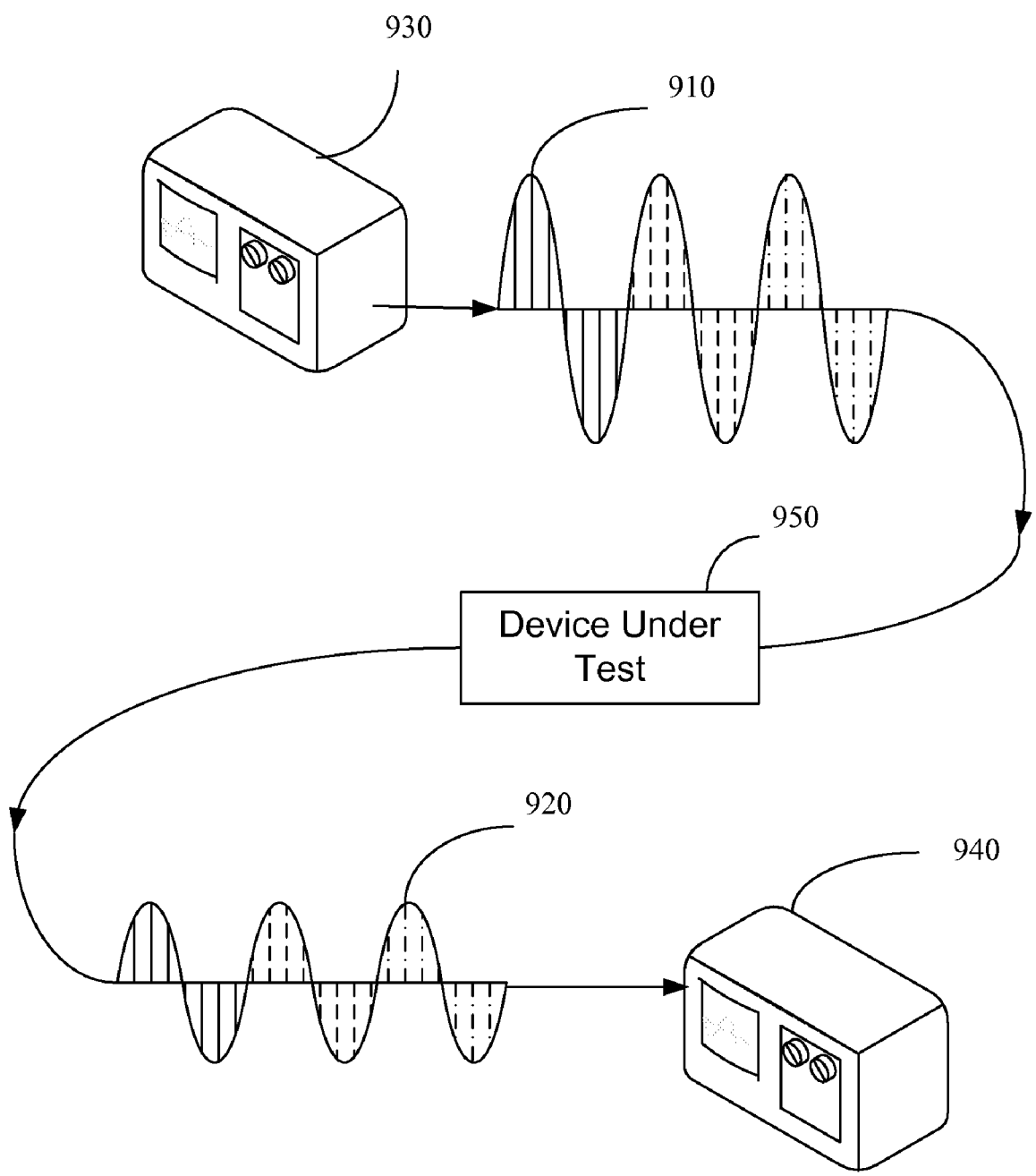
FIG. 9 provides a structural diagram of embodiments suitable for testing the response of a DUT to a waveform using relatively prime sampling.

An overview of embodiments suitable for sampling a waveform using relatively prime sampling techniques is provided in the diagrams of FIG. 9. This represents embodiments involving a variety of apparatuses, devices, and systems suitable for sampling a waveform using relatively prime sampling techniques. One skilled in the art would also recognize there are numerous ways to configure apparatuses and systems to achieve the similar results.

FIG. 9 provides an embodiment involving a system for sampling a waveform using relatively prime sampling methods. FIG. 9 includes a waveform generating device 930. Waveform generating device 930 may involve a variety of different devices including, but not limited to, a sound card, an digital-to-analog convert ("ADC"), a computer, a network analyzer, a scalar analyzer, a function generator, and/or a digital storage oscilloscope. Waveform generating device 930 may produce a waveform 910, which may include a plurality of cycles at a frequency. In some embodiments, the waveform may include more than one plurality of cycles at a frequency. Such a waveform may include a first plurality of cycles at a first frequency and a second plurality of cycles at a second frequency. Each waveform may be comprised of a plurality of base waveforms, wherein the waveform includes a plurality of the base waveforms. FIG. 9 shows that waveform 910 may be transmitted to DUT 950. In some embodiments, waveform 910 may bypass DUT 950 rather than being transmitted through DUT 950. In some embodiments, a waveform 920 may emerge from DUT 950 and be transmitted to a waveform receiving or sampling device 940. In some embodiments, waveform receiving or sampling device 940 may be the same device as the waveform generating device 930. Waveform receiving or sampling device 940 may involve a variety of different devices including, but not limited to, a sound card, an analog-to-digital converter ("ADC"), a computer, a network analyzer, a scalar analyzer, a function generator, and/or a digital storage oscilloscope. Waveform receiving or sampling device 940 may receive waveform 920 and sample waveform 920 using relatively prime sampling methods as generally disclosed in this Application.

Computer 1000 may comprise any device having processing capability sufficient to sample a waveform in accordance with embodiments. For example, computer 1000 may comprise a personal computer, a mainframe, or a laptop, whose mobility makes it especially convenient. Computer 1000 may be configured to control each of the components comprised by a Z box is generally disclosed in co-pending application U.S. patent application Ser. No. 12/337,317 filed on Dec. 17, 2008 by Valenti and entitled "Personal Computer Based Audio Frequency Impedance Analyzer."

Figure 10:
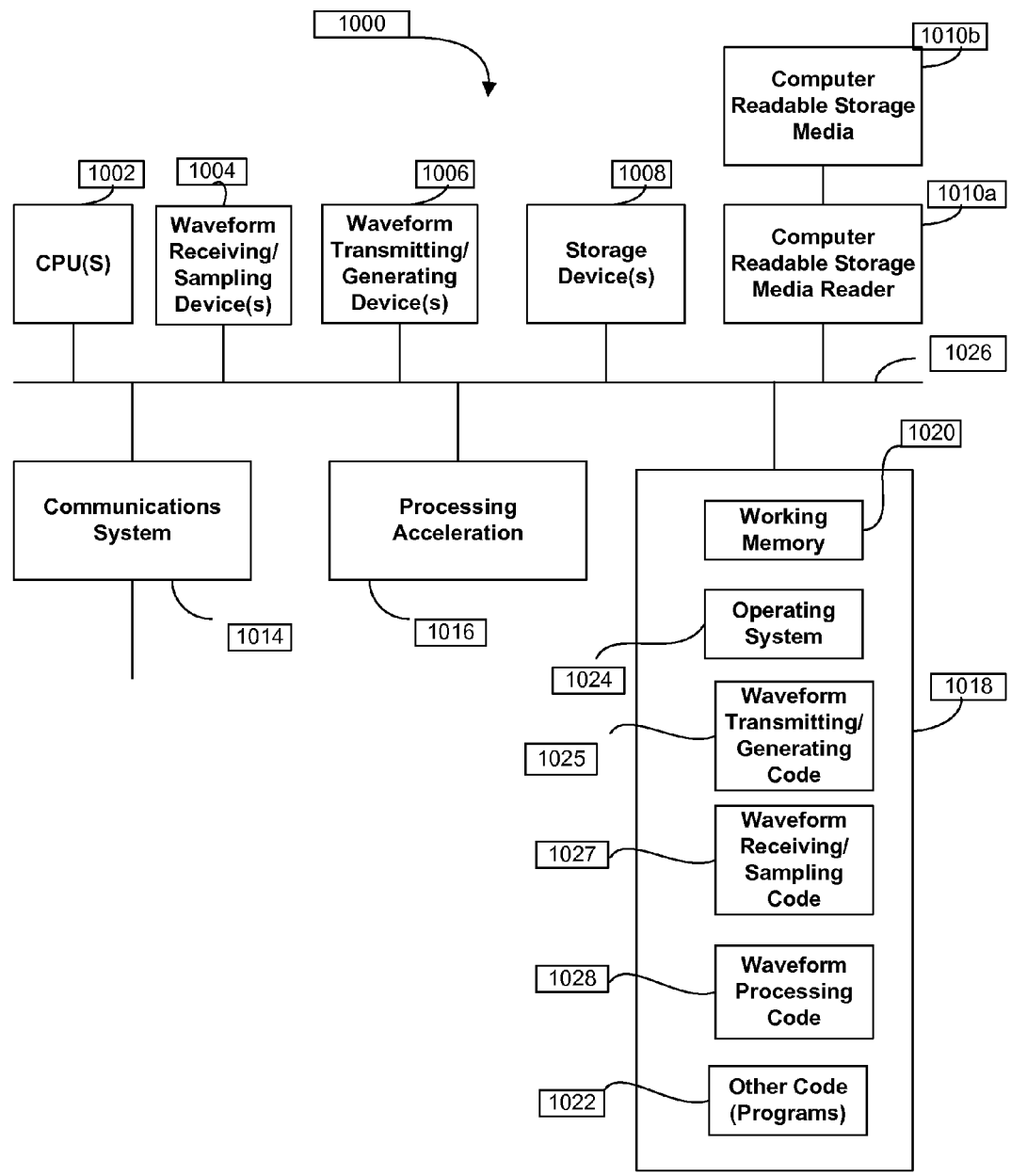
FIG. 10 provides a schematic diagram of a computer used in embodiments.

FIG. 10 provides a schematic illustration of a structural arrangement that may be used to implement computer 1000 according to an embodiment. In some embodiments a computer 1000 may represent a controller or computational device as referenced in this Application. FIG. 10 broadly illustrates how individual elements of computer 1000 may be implemented in a separated or more integrated manner. Computer 1000 is shown comprised of hardware elements that are electrically coupled via bus 1026, including a processor 1002, an input device such as a waveform receiving and/or sampling device(s) or component(s) 1004, an output device such as a waveform transmitting and/or generating device(s) or component(s) 1006, a storage device 1008, a computer-readable storage media reader 1010*a*, a communications system 1014, a processing acceleration unit 1016 such as a digital signal processor or special-purpose processor, and a memory 1018. The computer-readable storage media reader 1010*a* is further connected to a computer-readable storage medium 1010*b*, the combination comprehensively representing remote, local, fixed, and/or removable storage devices plus storage media for temporarily and/or more permanently containing computer-readable information. The communications system 1014 may comprise a wired, wireless, modem, and/or other type of interfacing connection and permits data to be exchanged with external devices as desired.

Computer 1000 also may comprise software elements, shown as being currently located within working memory 1020, including an operating system 1024 and other code 1022, such as a program designed to implement different embodiments. For example, computer 1000 may include device drivers for operating and controlling audio card, sound card, analog-to-digital converter, or digital-to-analog converter, or more generally, a waveform receiving device and/or a waveform generating or transmitting device. In addition, computer 1000 may utilize digital signal processing software elements. Memory 1018 may also include waveform generating code 1025, waveform receiving code 1027, and waveform processing code 1028. Furthermore, computer 1000 may comprise software elements designed to allow a user to input parameters of interest in studying the response of a DUT to a signal from waveform generating or transmitting device 1006. Computer 1000 may also include software elements designed to facilitate analyzing signals received from calibration and testing of a DUT in order to determine different measures of a DUT. It will be apparent to those skilled in the art that substantial variations may be made in accordance with specific requirements. For example, customized hardware might also be used and/or particular elements might be implemented in hardware, software (including portable software, such as applets), or both. Further, connection to other computing devices such as network input/output devices may be employed. Connections between the computer 1000 and various components of a Z box as disclosed in co-pending application U.S. patent application Ser. No. 12/337,317 filed on Dec. 17, 2008 by Valenti and entitled "Personal Computer Based Audio Frequency Impedance Analyzer" may use any suitable connection, such as a parallel-port connection, a universal-serial-bus ("USB") connection, and the like.

In some embodiments, waveform receiving and/or sampling device 1004 may comprise an analog-to-digital converter ("ADC"). In some embodiments, waveform transmitting device 1006 may comprise a digital-to-analog convert ("DAC"). In some embodiments, waveform receiving/sampling device 104 and waveform transmitting/generating device 1006 may comprise a sound card. A sound card may comprise a computer expansion card that facilitates the input and output of audio signals to and from computer 1000 under control of computer programs. In some embodiments, a sound card may provide the audio component for multimedia applications such as music composition, editing video or audio, presentation/education, and entertainment (games). In some embodiments, computer 1000 may have sound capabilities built in, while in other embodiments, computer 1000 may require additional expansion cards to provide for audio capability. In some embodiments, waveform transmitting/generating device 1006 and/or waveform receiving/sampling device 1004 may come already installed on computer 1000 when it is purchased. In some embodiments, waveform transmitting/generating device 1006 and/or waveform receiving/sampling device 1004 may be installed after purchases of computer 1000. Waveform transmitting/generating device 1006 and/or waveform receiving/sampling device 1004 may connect up to computer 1000 in many ways, including but not limited to the following examples: PCI, ISA, USB, IEEE 1394, Parallel Port, PCI-E, or PCMIA connections. In some embodiments, sound card 110 may be directly integrated into computer 100. Waveform transmitting/generating device 1006 and/or waveform receiving/sampling device 1004 may provide an output and input connection with different configurations as discussed throughout, including for example, but not limited to, TRS, RCA, and or DIN connectors. Waveform transmitting/generating device 1006 and/or waveform receiving/sampling device 1004 may send output signals over a wide range of frequencies. For example, in some embodiments, waveform transmitting/generating device 1006 and/or waveform receiving/sampling device 1004 may be capable of transmitting and receiving respectively frequencies ranging from 20 Hertz to 20,000 Hertz. Other embodiments of waveform transmitting/generating device 1006 and/or waveform receiving/sampling device 1004 may have higher and lower ranges. In some embodiments, waveform transmitting/generating device 1006 and/or waveform receiving/sampling device 1004 may have a lower range such as 5 Hertz, while other embodiments may have a high range, such as 100,000 Hertz, or even higher such as 1 Megahertz. Waveform transmitting/generating device 1006 and/or waveform receiving/ sampling device 1004 may produce and sample input signals respectively at a variety of sizes and rates. In some embodiments, waveform transmitting/generating device 1006 and/or waveform receiving/sampling device 1004 may produce and sample using 8 or 16 bit samples. In other embodiments, the bit sample size might be higher or lower, such as 32 bit samples for example. Merely by way of example, in some embodiments, waveform transmitting/generating device 1006 and/or waveform receiving/sampling device 1004 may produce and sample signals from about 4000 to 44,000 samples per second. In some embodiments, waveform transmitting/generating device 1006 and/or waveform receiving/sampling device 1004 may produce and sample respectively at higher or lower sampling rates, such as 48,000 samples per second, merely by way of example. In some embodiments, waveform transmitting/generating device 1006 and/or waveform receiving/sampling device 1004 may send and/or receive mono signals. In some embodiments, waveform transmitting/generating device 1006 and/or waveform receiving/sampling device 1004 may send and/or receive stereo signals. In some embodiments, waveform transmitting/generating device 1006 and/or waveform receiving/sampling device 1004 may cover different ranges, sizes, rates, or other characteristics from each other.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method for sampling waveforms using relatively prime number sampling, comprising:
    sampling, using a waveform sampling device, a waveform with a first plurality of cycles and a first frequency, wherein sampling the waveform includes:
        sampling at a first sampling rate of the waveform sampling device; and
        sampling a first sample number of samples of the waveform, wherein the first sample number is relatively prime with respect to the first plurality of cycles; and
    interleaving the first sample number of samples of the waveform with a controller.

2. The method for sampling waveforms using relatively prime number sampling of claim 1, wherein the first sample number is a prime number.

3. The method for sampling waveforms using relatively prime number sampling of claim 1, wherein the waveform sampling device is an analog-to-digital converter.

4. The method for sampling waveforms using relatively prime number sampling of claim 1, wherein the waveform sampling device is a sound card coupled with a computer.

5. The method for sampling waveforms using relatively prime number sampling of claim 1, wherein the waveform is dithered.

6. The method for sampling waveforms using relatively prime number sampling of claim 1, wherein the first sample number is a function of the first sampling rate and the first frequency.

7. The method for sampling waveforms using relatively prime number sampling of claim 6, wherein the function is approximately an inverse of a quotient of the first frequency and a product of a first cycle number and a first sampling rate of the waveform sampling device.

8. The method for sampling waveforms using relatively prime number sampling claim 1, further comprising:

sampling, with the waveform sampling device, a second waveform with a second plurality of cycles with a second frequency, wherein sampling the second waveform includes:
sampling at the first sampling rate of the waveform sampling device; and
sampling a second sample number of samples of the second waveform, wherein the second sample number is relatively prime with respect to the second plurality of full cycles; and
interleaving the second sample number of samples of the second waveform with a controller.

9. The method for sampling waveforms using relatively prime number sampling of claim 1, wherein sampling the waveform further comprises sampling a waveform transmitted through a device under test.

10. The method for sampling waveforms using relatively prime number sampling of claim 9, further comprising determining a transfer function for the device under test based on sampling the waveform transmitted through the device under test.

11. The method for sampling waveforms using relatively prime number sampling of claim 9, further comprising determining an impedance of the device under test.

12. The method for sampling waveforms using relatively prime number sampling of claim 9, further comprising determining a phase shift.

13. A method for generating waveforms for sampling using relatively prime number sampling, comprising:
determining a relatively prime sample number, wherein the relatively prime sample number is relatively prime with respect to a cycle number;
determining an adjusted frequency, wherein the adjusted frequency is:
approximately equal to a test frequency; and
a function of the relatively prime sample number, the cycle number, and a sampling rate of a waveform sampling device; and
transmitting a waveform with the adjusted frequency and the cycle number of cycles with a waveform generating device.

14. The method for generating waveforms for sampling using relatively prime number sampling of claim 13, wherein the function approximately equals the inverse of a quotient of the relatively prime sample number and a product of the cycle number and the sampling rate.

15. The method for generating waveforms for sampling using relatively prime number sampling of claim 13, wherein a user determines the test frequency.

16. The method for generating waveforms for sampling using relatively prime number sampling of claim 13, wherein the wave generating device is a digital-to-analog converter.

17. The method for generating waveforms for sampling using relatively prime number sampling of claim 16, wherein the digital-to-analog converter is a sound card coupled with a computer.

18. The method for generating waveforms for sampling using relatively prime number sampling of claim 13, further comprising:
sampling, with a waveform sampling device, a second waveform with the adjusted frequency and the cycle number of cycles, wherein sampling the second waveform includes:
sampling at the sampling rate of the waveform sampling device; and
sampling the second waveform the relatively prime sample number of times; and
interleaving the relatively prime number of samples of the second waveform with a controller.

19. The method for generating waveforms for sampling using relatively prime number sampling of claim 18, wherein the waveform is transmitted to a device under test and the second waveform is received from the device under test.

20. A system for sampling waveforms using relatively prime number sampling, comprising:
a computational device;
a waveform generating device coupled with the computational device and configured to transmit a first waveform with a plurality of cycles and a frequency; and
a waveform sampling device coupled with the computational device and configured to sample a second waveform with the plurality of cycles and the frequency a sample number of times, wherein the sample number is relatively prime with respect to the plurality of cycles.

21. The system for sampling waveforms using relatively prime number sampling of claim 20, wherein the first waveform is transmitted to a device under test from the waveform generating device and the second waveform is received from the device under test at the waveform sampling device.

22. A device for sampling waveforms using relatively prime number sampling, comprising:
means for sampling a waveform with a plurality of cycles and a frequency, wherein sampling the waveform includes:
sampling at a sampling rate; and
sampling a sample number of samples of the waveform, wherein the sample number is relatively prime with respect to the plurality of cycles; and
means for interleaving the sample number of samples of the waveform.

23. The device for sampling waveforms using relatively prime number sampling of claim 22, further comprising:
means for dithering the sample number of samples of the waveform.

24. The device for sampling waveforms of claim 22, further comprising:
means for determining a relatively prime sample number, wherein the relatively prime sample number is relatively prime with respect to a cycle number;
means for determining an adjusted frequency, wherein the adjusted frequency approximately equals a test frequency and is a function of the relatively prime sample number, the cycle number, and a sample rate; and
means for transmitting a cycle number of cycles of a waveform with the adjusted frequency.

* * * * *